United States Patent [19]

Pravin

[11] 4,006,046
[45] Feb. 1, 1977

[54] METHOD FOR COMPENSATING FOR EMITTER-PUSH EFFECT IN THE FABRICATION OF TRANSISTORS

[75] Inventor: Parekh C. Pravin, Winchester, Mass.

[73] Assignee: TRW Inc., Los Angeles, Calif.

[22] Filed: Apr. 21, 1975

[21] Appl. No.: 570,036

[52] U.S. Cl. .............................. 148/187; 148/188; 357/22
[51] Int. Cl.² ............................ H01L 21/225
[58] Field of Search ............... 148/188, 187

[56] References Cited

UNITED STATES PATENTS

| 3,575,742 | 4/1971 | Gilbert | 148/187 |
| 3,586,548 | 6/1971 | Pommerrenig | 148/187 |
| 3,615,938 | 10/1971 | Tsai | 148/187 |
| 3,719,535 | 3/1973 | Zoroglu | 148/187 |
| 3,765,963 | 10/1973 | Okabe et al. | 148/188 |
| 3,767,484 | 10/1973 | Takagi et al. | 148/188 |
| 3,839,104 | 10/1974 | Yuan | 148/188 |
| 3,915,767 | 10/1975 | Welliver | 148/188 X |

*Primary Examiner*—G. Ozaki
*Attorney, Agent, or Firm*—Spensley, Horn & Lubitz

[57] ABSTRACT

A semiconductor wafer having a base dopant source disposed on its surface receives a surface coating consisting of, for example, a silicon nitride film. An emitter opening is formed in the silicon nitride surface coating and a portion of the base dopant source is stripped away within the emitter opening. Diffusion of the base region will result in predetermined geometrical regions of varying concentration of the base dopant as a result of the surface coating and the effect of the oxidizing atmosphere. Subsequent deposition and diffusion of the emitter region provides for smaller base widths and eliminates the need for subsequent deposition and diffusion of high concentration base dopant contact regions.

13 Claims, 5 Drawing Figures

METHOD FOR COMPENSATING FOR EMITTER-PUSH EFFECT IN THE FABRICATION OF TRANSISTORS

BACKGROUND OF THE INVENTION

1. Field of the Invention

The present invention generally relates to methods for fabricating semiconductor devices and more particularly to those methods utilized for the fabrication of microwave transistors.

2. Prior Art

The methods for fabricating semiconductors as disclosed by the prior art indicate a number of procedures wherein silicon nitride films are utilized. In one of the patents disclosed by the prior art, a semiconductor element utilizes a surface coating of silicon nitride and silicon dioxide, the individual films covering different surfaces portions of the semiconductor substrate. The utilization of different surface materials enables selective diffusion of impurities such as gallium and antimony. In a semiconductor device formed by this method, the surface coating acts as a satisfactory surface protective film against the external atmosphere. In addition, the process is used to terminate the PN junction beneath the silicon nitride film.

In another method disclosed by the prior art, silicon nitride is used as an etching stencil so as to better locate contact windows relative to one another in a silicon dioxide layer. This method uses additional photoresist layers after etching through the silicon nitride layer to more accurately control positioning of the region openings. As with the other pieces of prior art, the use of silicon nitride layers has no relationship to the present invention.

In the construction of transistors pursuant to the prior art methods, a basic problem is encountered. Where an NPN transistor is to be fabricated, a semiconductor wafer of N-type conductivity has a base region formed therein through the use of a conventional P-type base dopant such as boron. The transistor is completed by the disposition of an N-type emitter region within the base region, the typical emitter dopants being phosphorus or arsenic. In the fabrication of transistors, it is clearly necessary that there be two consecutive diffusion steps. In such a case, the diffusion of the emitter region uses a surface layer having a high surface concentration. As is described in the publication Physics and Technology of Semiconductor Devices by A. S. Grove, John Wiley & Sons, Inc., 1967 at Page 64, an emitter-push effect is created. Where boron is used for a base dopant and phosphorus is utilized for the emitter dopant, the boron distribution in the silicon is both under a high concentration phosphorus-diffused region and elsewhere in the sample. The emitter-push effect arises where the phosphorus diffusion "pushes" the boron distribution ahead of it. This brings about an irregular junction boundary.

Where the emitter-push effect is created, a number of problems result. A lower limit on the value of base width is imposed since further penetration of the emitter diffusion front into the wafer can cause the emitter region to punch through the PN junction at the irregular boundary caused by the emitter-push effect. Restricting the value of the base width will degrade the frequency response and performance of a transistor since the transmit time will be degraded.

Another problem which exists in the prior art is based upon the necessity to provide for P+ regions within the base region for the purpose of improving base resistance characteristics. The present invention solves this problem by totally eliminating the need for the deposition and diffusion of P+ regions. The present invention method provides for a base region which has a higher concentration outside of the emitter region. As a result, the high concentration diffusion front of the base region is directly adjacent the emitter diffusion front thereby reducing base resistance without the need for performing the additional process steps.

SUMMARY OF THE INVENTION

The present invention comprises a method for fabricating microwave transistors in a manner which compensates for or otherwise eliminates the emitter-push effect normally encountered in the fabrication of such devices. A semiconductor wafer typically of N-type conductivity is utilized. After the disposition of a conventional passivating layer, a base opening is formed therein exposing the surface of the silicon wafer. A base dopant source of an appropriate conductivity type is disposed upon the surface of the silicon wafer, the base dopant source adjacent the opened base area typically being boron oxide. After disposing the base dopant source upon the surface of the silicon wafer, a second suitable passivating layer such as silicon nitride is formed across the total layer of the silicon wafer. Following the deposition of the silicon nitride layer, a layer of tetraethylorthosilicate (TEOS) is disposed upon the silicon nitride layer, the deposition of the TEOS layer being followed by the formation of the base opening.

The ability to produce a transistor without the deleterious emitter-push effect is achieved by adjusting the regional concentration of the base dopant during the formation of the base region. In the conventional process of fabricating transistors, a phenomenon occurs which is alternatively described as emitter-push, emitter-dip or cooperative diffusion effect. The phenomenon consists of the enhanced diffusion of a diffused layer in regions where a second, high concentration diffused layer penetrates the silicon. It is often observed in transistor structures which, by necessity, must employ two consecutive diffusions with the second one, the emitter having a high surface concentration. Where boron and phosphorus are used as the dopants for the base and emitter regions respectively, the emitter-push effect results in the phosphorus diffusion front pushing the boron distribution ahead of it. This results in an irregular junction boundary. Several explanations of this effect have been proposed. It appears most likely that straining of the lattice by the high concentration of impurities is involved. The emitter-push effect results in serious limitations in the fabrication of high frequency transistors. High frequency transistors require narrow base widths and reduced base resistance in order to reach high performance levels. Where a phosphorus dopant is used for the formation of the emitter region, the emitter-push effect will place a lower limit on the value of the base width and thereby degrade the frequency response and performance of a microwave transistor. In addition, the reduction in the base resistance typically requires the performance of additional process steps. Where an NPN transistor is being formed, the reduction in base resistance typically necessitates the deposition and diffusion of a P+ type region within the base region thus requiring additional process steps which can degrade dice yield. In addition, P+ deposition systems are complex and not always controllable. The inability to control the P+ deposition systems can result in additional loss in dice yield. In an ideal microwave transistor, the P+ diffusion front should be adjacent the emitter diffusion front. Since the irregular PN junction boundary resulting from the emitter push effect makes it virtually impossible to place the emitter diffusion front adjacent the P+ diffusion front, the DC and RF performance of the semiconductor device will vary from wafer to wafer.

In the process of the present invention, a portion of the base dopant, i.e., boron, is disposed beneath the silicon nitride layer or a subsequently disposed passivating layer. After removing the boron skin within the emitter opening, the semiconductor wafer is heated for a sufficient time within an appropriate environment to diffuse the base region into the N-type silicon wafer. Since a portion of the boron lies beneath the shield of the passivating layers, this portion of the dopant will diffuse to a greater depth into the silicon wafer. The diffusion of the base region takes place in an oxidizing atmosphere, the passivating layers maintaining a higher concentration of boron beneath its boundaries as opposed to the concentration of the base region beneath the emitter opening. The resulting diffusion of the base region will produce a region having an irregular boundary. The portion of the base region beneath the emitter opening will have a lower dopant concentration and have a shallower depth that the base region beneath the passivating layers. With a base region thus formed, the subsequent diffusion of an emitter dopant will cause the formation of an emitter region substantially bounded by the emitter opening, the high concentration of the base dopant beneath the passivating layers substantially preventing lateral diffusion of the emitter dopant. During the emitter diffusion operation, a shallow portion of the base region beneath the emitter opening will be pushed ahead of the emitter diffusion, but the boundary of the base region will not result in the emitter-push effect encountered with the processes described in the prior art.

It is therefore an object of the present invention to provide an improved method for the fabrication of high frequency transistors.

It is another object of the present invention to provide a method for fabricating microwave transistors which compensate for emitter-push effects.

It is still another object of the present invention to provide a method for fabricating transistors which obviates subsequent processing steps for creating high concentration diffusion regions within the base region.

It is yet another object of the present invention to provide a method for fabricating high frequency transistors which provides for narrower base widths.

The novel features which are believed to be characteristic of the invention, both as to its organization and method of operation, together with further objectives and advantages thereof, will be better understood from the following description considered in connection with the accompanying drawing in which a presently preferred embodiment of the invention is illustrated by way of example. It is to be expressly understood, however, that the drawing is for the purpose of illustration and description only and is not intended as a definition of the limits of the invention.

DESCRIPTION OF THE PRESENTLY PREFERRED EMBODIMENT

Figure 1:
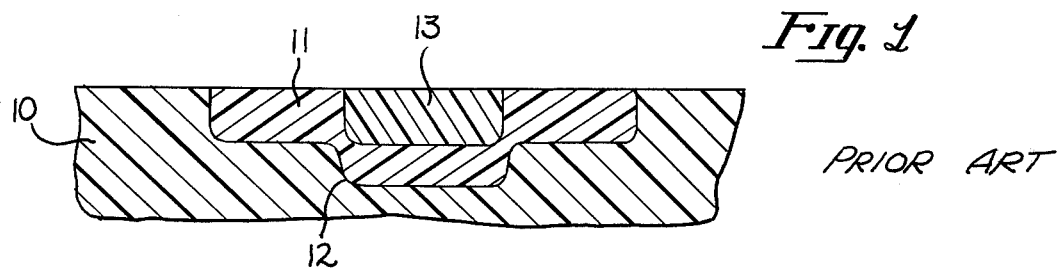
FIG. 1 is a side elevation, cross-sectional schematic view of a transistor fabricated pursuant to the processes described by the prior art and illustrating the emitter-push effect.

Referring now to FIG. 1, a cross-sectional view of a transistor processed in accordance with the prior art is shown. For the purpose of example only, the semiconductor wafer 10 shown in FIG. 1 is deemed to be of N-type conductivity and will constitute the collector region of a transistor chip to be fabricated in accordance with the processes described in the prior art. Base region 11 is diffused within the N-type region 10 and exhibits the irregular boundary layer 12 which is alternately referred to as the emitter-dip effect, emitter-push effect or cooperative diffusion effect. The emitter-push effect represented by the irregular boundary layer 12 is a result of the diffusion of the emitter region 13.

The emitter-push effect comprises the enhanced diffusion of a diffused layer in regions where a second, high concentration diffused layer, i.e., emitter region 13, penetrates silicon wafer 10. The emitter-push effect is clearly observed in transistor structures which, by necessity, employ two sequential diffusion steps, the emitter diffusion typically exhibiting a high surface concentration. In the transistor chip shown in FIG. 1, base region 11 comprises a dopant of P-type conductivity such as boron. Emitter region 13 comprises a dopant of P-type conductivity such as phosphorus or arsenic.

In FIG. 1, the boron distribution represented by base region 11 is shown both under the high concentration emitter-diffused region 13 and elsewhere in wafer 10. It is evident that the emitter diffusion represented by region 13 has pushed the base distribution 11 ahead of it during the diffusion process. This results in the irregular junction boundary 12 as shown in FIG. 1.

The emitter-push effect illustrated in FIG. 1 is sought to be explained by several possibilities. The most likely explanation for the emitter-push effect illustrated in FIG. 1 is a result of the straining of the lattice by the high concentration of impurities. Irrespective of the cause for the emitter-push effect and the irregular junction boundary 12 formed thereby, the deleterious effects brought about by such an effect are clear. In the fabrication of high frequency transistors, a characteristic which is sought to be achieved is a small or narrow base width. Because of the emitter-push effect shown in FIG. 1, the base width is typically limited to a value of 2500 Angstroms for shallow diffusion process steps. The irregular junction boundary 12 limits the base width since an attempt to further diffuse emitter region 13 could cause emitter region 13 to punch through or otherwise penetrate the PN junction formed between base region 12 and the remainder of silicon wafer 10. This would clearly reduce the yield of such semiconductor devices. Another characteristic of high frequency transistors which is sought to be achieved is a lower base resistance. In typical process steps, a P+ diffusion is carried out in order to lower the base contact resistance and the value of the base resistance. This is particularly necessary in light of the emitter-push effect since the constriction caused by irregular junction boundary 12 will cause an increase in the resistance of the base region.

Figure 2:
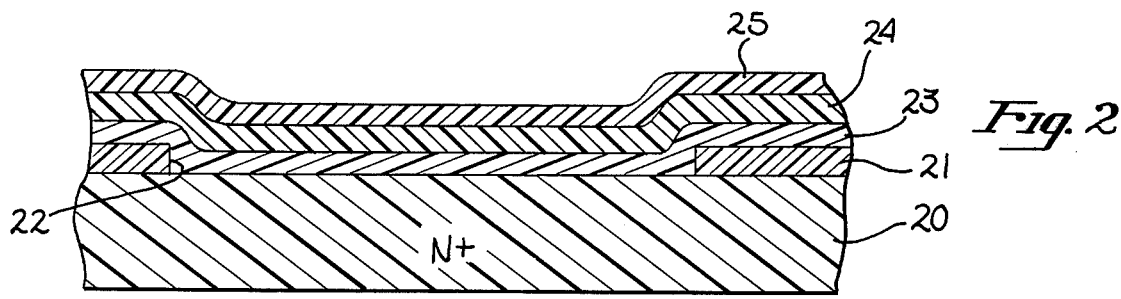
FIG. 2 is a side elevation, cross-sectional view illustrating steps of the present invention comprising formation of the base opening and the sequential deposition of the base dopant and subsequent passivating layers.

The present invention compensates for the emitter-push effect through the use of a series of process steps which combine to negate the irregular boundary 12 shown in FIG. 1 as well as eliminate the necessity for subsequent process steps to reduce the base resistance. Referring now to FIG. 2, a cross-sectional schematic view of a semiconductor wafer is shown illustrating the first series of process steps carried out in accordance with the present invention method. A semiconductor wafer 20 of a given conductivity type is provided. Although the specific conductivity type is a matter of choice, the description of the present invention will presume that semiconductor wafer 20 is of N-type conductivity. The first step in the present invention method is the deposition of a first passivating layer 21, passivating layer 21 typically being silicon dioxide. The formation of silicon dioxide layer 21 can be by a number of conventional steps, such as heating substrate 20 to a temperature above 1000° C in an oxidizing atmosphere thereby causing thermal growth of silicon dioxide layer 21. As an alternative organo-oxy-silane can be thermally decomposed at a relatively low temperature of 700° to 800° C thereby causing the deposition of oxide film 21 on the surface of semiconductor wafer 20.

Following the formation of passivating layer 21, the opening 22 for the formation of the base region is formed. The etching of silicon dioxide layer 21 typically utilizes conventional photolithographic methods. By disposing a conventional photoresist material upon passivating layer 21, and exposing said layer to light through an appropriate mask, etching of the photoresist and silicon dioxide layer 21 by an appropriate etchant such as hydrofluoric acid will produce base opening 22.

After the photoresist material is appropriately rinsed, the base dopant must be disposed upon base opening 22. Since the assumed conductivity of a wafer 20 requires that base dopant be of P-type conductivity, a typical base dopant would be boron. In a preferred form of the present invention, a boron nitride sheet is utilized, the deposition of the boron forming a layer of boron oxide 23 upon base opening 22. As is well known to the art, a boron nitride layer disposed on a ceramic sheet is juxtaposed to the silicon wafer. Both are heated in the presence of oxygen and the boron nitride breaks down. Boron diffuses from the ceramic sheet to the silicon wafer. The diffused boron is incorporated into the exposed silicon as a boron oxide layer. Some of the boron may also diffuse during the initial deposition into the silicon to form what may be termed, together with the boron oxide layer, as "a boron skin". The mechanics of boron diffusion in silicon are well known. Following the deposition of the base dopant 23, a second passivating layer is disposed upon the disposed base dopant layer 23. Although passivating layer 24 can be formed of any suitable surface coating, the preferred form of the present invention method utilizes silicon nitride. Silicon nitride layer 24 can typically be formed by exposing the silicon substrate 20 shown in FIG. 2 to a nitrogen gas atmosphere and subjecting it to heat treatment at about 1250° C for about 30 minutes to 1 hour. As an alternative, silicon nitride layer 24 may be formed by employing hydrogen gas as a carrier gas, mixing a nitride such as ammonia or hydrazine with a silicon compound such as silane, entrained on a carrier gas, and causing reaction therebetween at a temperature of about 900° – 1200° C thereby causing the deposition of a silicon nitride layer 24 upon the disposed base dopant layer 23.

Since a conventional photoresist layer will not provide an appropriate mask for etching silicon nitride, a layer 25 of tetraethylorthosilicate (TEOS) is disposed upon silicon nitride layer 24. Although TEOS is a preferred material for implementing masking layer 25, it is clear that any other masking material which is appropriate for the described function can be utilized.

Figure 3:
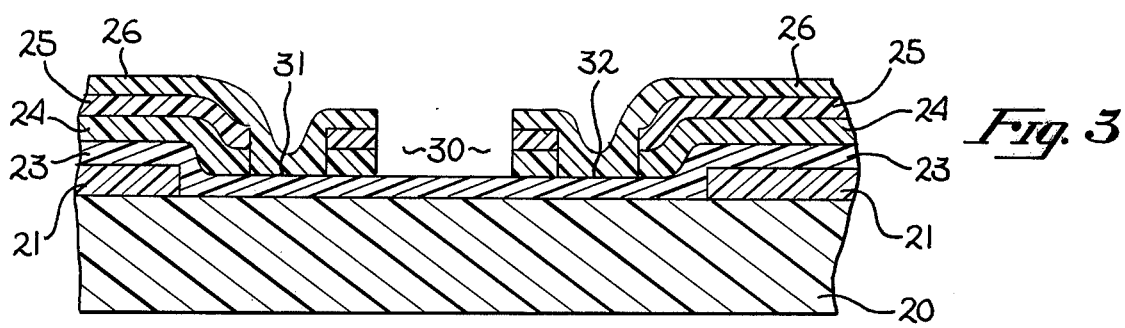
FIG. 3 is a side elevation, cross-sectional view of the semiconductor wafer shown in FIG. 2 indicating the subsequent process steps providing for the deposition of an additional passivating layer and the opening of the emitter and base contact regions.

Referring now to FIG. 3, the semiconductor wafer of FIG. 2 is shown following the formation of emitter opening 30 and base contact openings 31 and 32. The formation of emitter opening 30 utilizes an appropriate mask for defining the pattern of the emitter region which is to be disposed within the base region, the emitter pattern clearly being one of choice based upon the requirements of the transistor being fabricated. Following the formation of emitter opening 30 and base contact openings 31 and 32, a second layer 26 of TEOS is disposed over the complete surface of semiconductor wafer 20. TEOS layer 26 is used to passivate the base dopant layer 23 in contact openings 31 and 32 during the diffusion of the base region. Although layer 26 can be formed of any suitable material capable of performing the stated function, the preferred form of the present invention method utilizes TEOS. At this point, the next step in the present invention method requires the removal of layer 26 above emitter opening 30 through the use of conventional photolithographic techniques. Following completion of the above-defined steps, FIG. 3 illustrates the semiconductor wafer 20 having the portion of the base dopant layer 23 exposed within the emitter opening 30, the remaining portion of base dopant layer 23 within base opening 22 being covered by appropriate passivating layers 25 and 26. After emitter opening 30 is again opened exposing the portion of base dopant layer 23, i.e., boron, a portion of the boron skin is etched away.

Figure 4:
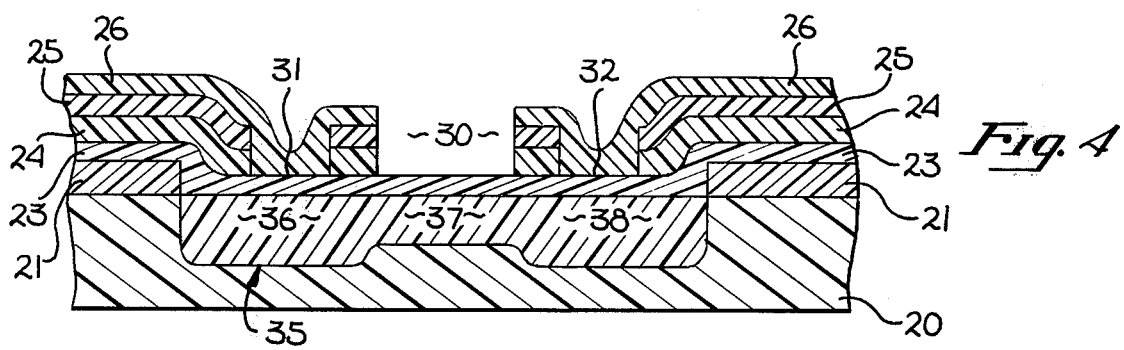
FIG. 4 illustrates a semiconductor wafer shown in FIG. 2 following the diffusion of the base region in accordance withe the present invention.

After removing a portion of the boron skin within emitter opening 30, the entire wafer 20 is subjected to an appropriate heat treatment schedule to diffuse the base region within wafer 20. Referring now to FIG. 4, semiconductor wafer 20 is shown following the diffusion of base region 36, 37, 38 within wafer 20. Under conventional processes for manufacturing transistors, the diffusion front of the base region would be substantially uniform providing for a regular junction boundary between the wafer and the diffused region. As can be seen in FIG. 4, the irregular junction boundary 35 is formed following the diffusion step to diffuse the base dopant into wafer 20. The junction boundary 35 outlining the diffused base region defines three segments 36, 37 and 38. Regions 36 and 38 of the diffused base dopant were covered by appropriate passivating layers 24 and 26 during the diffusion step. On the other hand, segment 37 underlies the open emitter opening 30 and was subjected to a partial removal of the boron skin prior to the diffusion step. Since diffusion rate is a function of concentration, it is clear that regions 36 and 38 are at a greater depth due to the greater concentration of base dopant overlying those areas. The typical diffusion process utilized to produce the effect shown in FIG. 4 requires the sequential heating of the wafer at a temperature of 1025° C, the heating step being carried out for 20 minutes in an atmosphere of dry oxygen followed by four minutes in a hydrated oxygen atmosphere. The resulting diffusion pattern shown in FIG. 4 illustrates that segment 37 has a lower concentration of P-type dopants than either segments 36 or 38. In addition, since region 37 is of lower concentration, it will have been diffused to a shallower depth than either segments 36 or 38.

Figure 5:
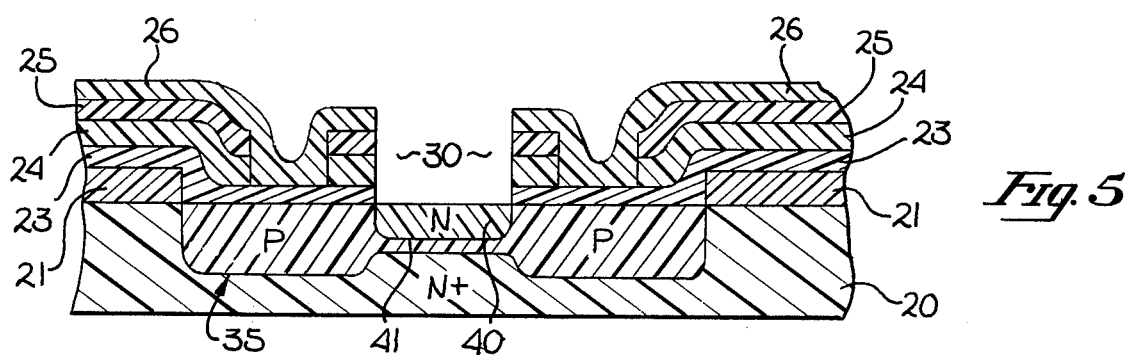
FIG. 5 illustrates the semiconductor wafer shown in FIG. 4 after the diffusion of the emitter region.

FIG. 5 illustrates the final steps of the present invention method. Following the diffusion of the base region, an appropriate N-type dopant is disposed within emitter opening 30 and diffused into base region forming emitter region 40. As was shown in FIG. 1, where the boundary of the base region was uniform, the diffusion of the emitter region 13 caused the irregular junction boundary 12 typically called the emitter-push effect. As can be seen in FIG. 5, the diffusion of the emitter region pushes the boron distribution ahead of it, but the emitter-push effect created during the processes described by the prior art is substantially eliminated. The emitter diffusion front 41 can be disposed substantially adjacent the junction and boundary 35 of the base region thereby providing a base width which can be substantially narrower than that which could be achieved in the prior art, i.e., less than 2500 Angstroms. The present invention can produce base widths in the range of 1000 – 1500 Angstroms. In addition, since the concentration of segments 36 and 38 of base region 35 are higher than the concentration of segment 37, this will tend to retard any lateral diffusion of emitter front 41 and will provide for greater control over the direction of the diffused region 40. It can therefore be seen that the production of a base region having defined concentration variants will compensate for, or otherwise eliminate, the emitter-push effect and provide for a base width which is much narrower than that which could be achieved by the processes defined by the prior art.

The present invention method also provides additional advantages over those methods described in the prior art. As stated previously, the introduction of a P+ region into the base region was required to reduce base resistance. In addition, performance of a high frequency transistor will be optimized by a structure whereby the emitter diffusion front was adjacent the P+ region. The present invention method provides precisely those characteristics which are advantageous for the production of high frequency transistors. Since segments 36 and 38 of base region 35 are high concentration regions, the diffusion of emitter region 40 will be precisely adjacent the high concentration segments 36 and 38 of base region 35. The production of the concentration variants eliminates the need for the P+ deposition and diffusion steps which are normally required to produce such devices. Since P+ deposition and diffusion process is complex and difficult to control, the elimination of such steps clearly will increase the production yield which can be achieved.

The present invention method provides for an improved process to manufacture high frequency transistors which exhibit superior performance characteristics. In addition, through the elimination of complex process steps, the economic advantages gained by the present invention are clear. Therefore, the present invention method eliminates phenomenon which has adversely affected the production of high frequency transistors and provided for the elimination of process steps which affect production yield.

I claim:
1. A method for fabricating an electrical translating device comprising the steps of:
    a. providing a semiconductor wafer of a first conductivity type;
    b. disposing a first passivating layer on the surface of said semiconductor wafer;
    c. forming an opening in said first passivating layer exposing a portion of the surface of said semiconductor wafer;
    d. disposing a first dopant layer of a second conductivity type opposite to said first conductivity type at least within said opening;
    e. disposing a second passivating nitride layer upon said first dopant layer;
    f. forming an opening in said second passivating layer which is smaller than the opening in said first passivating layer exposing a portion of said first dopant layer;
    g. removing a uniform portion of said exposed first dopant layer; and
    h. diffusing a first dopant from said first dopant layer into said semiconductor wafer and forming a first and second concentration region of said first dopant, said first concentration region being beneath said second passivating layer and having a greater concentration of said first dopant than said second concentration region of said semiconductor wafer, said second concentration region being beneath said opening in said second passivating layer.

2. A method for fabricating an electrical translating device as defined in claim 1 further including the steps of:
    a. disposing a second dopant layer of said first conductivity type at least within the opening in said second passivating layer; and
    b. diffusing a second dopant from said dopant layer into said semiconductor wafer within at least said second concentration region of said semiconductor wafer.

3. A method for fabricating an electrical translating device as defined in claim 2 wherein said second dopant is diffused into said semiconductor wafer substantially within the lower concentration region thereof.

4. A method for fabricating an electrical translating device as defined in claim 1 further comprising the steps of:
    a. forming an opening in said second passivating layer exposing the surface of said semiconductor wafer; and
    b. making electrical contact to said first concentration region of said semiconductor wafer.

5. A method in the fabrication of a transistor comprising the steps of:
    a. providing a silicon wafer of a first conductivity type;

b. disposing a first passivating layer on the surface of said first semiconductor wafer;

c. forming a base opening in said first passivating layer thereby exposing a portion of the surface of said semiconductor wafer;

d. disposing a base dopant layer at least within said base opening, said base dopant layer having a second conductivity type opposite to said first conductivity type;

e. disposing a layer of silicon nitride upon said base dopant layer;

f. forming an emitter opening and a base contact opening in said silicon nitride layer, said emitter opening and said base contact opening being within the boundary of said base opening;

g. disposing a second passivating layer upon and covering said emitter and base contact openings;

h. exposing said base dopant layer within said emitter opening by selectively removing a portion of said second passivating layer;

i. removing a uniform portion of said exposed base dopant layer; and j. diffusing a base of dopant from said base dopant layer into said silicon wafer and forming a first concentration region of said base dopant beneath said silicon nitride and second passivating layer having a greater concentration of said base dopant than a second concentration region of said base dopant formed beneath said emitter opening, said first and second concentration regions forming a base dopant region.

6. A method as defined in claim 5 further including the steps of:

a. disposing an emitter dopant layer of said first conductivity type at least within the emitter opening; and b. diffusing a second dopant from said emitter dopant layer into said silicon wafer within said base dopant region whereby the diffusion front of said second dopant pushes the dopant distribution of said second concentration region before it to produce a substantially uniform boundary between said base dopant region and said silicon wafer.

7. A method as defined in claim 6 wherein said second dopant from said emitter dopant layer is diffused within said base dopant region substantially within, said second concentration region.

8. A method as defined in claim 5 wherein said step of diffusing said second dopant from said base dopant layer comprises the steps of sequentially heating said silicon wafer at a temperature of approximately 1025° C for 20 minutes in an atmosphere of dry oxygen followed by heating said silicon wafer at a temperature of approximately 1025° C for 4 minutes in an atmosphere of hydrated oxygen.

9. A method in the fabrication of a transistor comprising the steps of:

a. providing a silicon wafer of N-type conductivity having a first passivating surface layer disposed thereon;

b. forming a base region opening in said first passivating layer;

c. disposing a base dopant layer of P-type conductivity at least within said base region opening;

d. disposing a layer of silicon nitride upon said base region dopant layer;

e. forming an emitter opening and a plurality of base contact openings in said silicon nitride layer within the boundary of said base region opening whereby the base dopant layer within said emitter opening and said base contact openings are exposed;

f. disposing a layer of tetraethylorthosilicate at least upon and covering the base dopant layer exposed by said emitter and base contact openings;

g. etching said tetraethylorthosilicate layer within the boundary defined by said emitter opening whereby said base dopant layer is exposed;

h. removing uniform portions of the base dopant layer exposed within the boundary of said emitter opening; and i. diffusing a base dopant from said base dopant layer into said silicon wafer, to form a base dopant distribution region beneath said emitter opening, said base dopant distribution region being diffused to a shallower depth than the base dopant beneath said silicon nitride and tetraethylorthosilicate layers.

10. A method as defined in claim 9 further including the steps of:

a. disposing an emitter dopant region of N-type conductivity at least within the emitter opening defined in said silicon nitride and tetraethylorthosilicate layers; and b. diffusing an emitter dopant from said emitter dopant layer into said silicon wafer within said base dopant distribution region whereby the diffusion front of said emitter dopant pushes the distribution of said base dopant before it to produce a substantially uniform boundary between said base dopant distribution region and said silicon wafer.

11. A method as defined in claim 9 wherein said diffusing steps forms a first concentration region of said base dopant beneath the silicon nitride and tetraethylorthosilicate layers which has a greater concentration of said base dopant than a second concentration region of said base dopant beneath said emitter opening.

12. A method as defined in claim 11 wherein said emitter dopant region is diffused within said base. depant distribution region substantially within said second concentration region.

13. A method as defined in claim 9 wherein said step of diffusing said base dopant layer comprises the steps of sequentially heating said silicon wafer at a temperature of approximately 1025° C for 20 minutes in an atmosphere of dry oxygen followed by heating said silicon wafer at a temperature of approximately 1025° C for 4 minutes in an atmosphere of hydrated oxygen.

* * * * *

UNITED STATES PATENT AND TRADEMARK OFFICE
CERTIFICATE OF CORRECTION

PATENT NO. : 4,006,046
DATED : February 1, 1977
INVENTOR(S) : Pravin C. Parekh

It is certified that error appears in the above-identified patent and that said Letters Patent are hereby corrected as shown below:

The name of the inventor is to read:

--PRAVIN C. PAREKH-- instead of

"PAREKH C. PRAVIN".

Signed and Sealed this

Sixth Day of September 1977

[SEAL]

Attest:

RUTH C. MASON
*Attesting Officer*

LUTRELLE F. PARKER
*Acting Commissioner of Patents and Trademarks*